United States Patent [19]

Mueller-Fiedler et al.

[11] Patent Number: 5,577,142
[45] Date of Patent: Nov. 19, 1996

[54] OPTICAL FIBER TRANSMITTING AND RECEIVING COMMUNICATIONS DEVICE

[75] Inventors: Roland Mueller-Fiedler, Leonberg; Klaus-Michael Mayer, Gerlingen; Wolf-Henning Rech, Griesheim; Heiner Hauer, Fellbach; Albrecht Kuke, Auenwald; Thomas Schwander, Backnang; Bernhard Schwaderer, Weissach im Tal, all of Germany

[73] Assignee: ANT Nachrichtentechnik G.m.b.H., Backnang, Germany

[21] Appl. No.: 559,373

[22] Filed: Nov. 16, 1995

[30] Foreign Application Priority Data

Nov. 17, 1994 [DE] Germany .......................... 44 40 935.4

[51] Int. Cl.⁶ .............................. G02B 6/26; H04B 10/00
[52] U.S. Cl. ............................... 385/47; 385/15; 385/39; 385/49; 385/88; 385/131; 359/154
[58] Field of Search ....................... 385/14, 15, 24, 385/31, 39, 47, 49, 50, 52, 88, 89, 92, 130, 131; 359/154, 169, 170, 193, 113, 114, 115, 124

[56] References Cited

U.S. PATENT DOCUMENTS

| | | | |
|---|---|---|---|
| 4,897,711 | 1/1990 | Blonder et al. | 385/88 X |
| 4,904,036 | 2/1990 | Blonder | 385/49 X |
| 4,969,712 | 11/1990 | Westwood et al. | 385/49 X |
| 5,073,003 | 12/1991 | Clark | 385/33 |
| 5,125,054 | 6/1992 | Ackley et al. | 385/49 |
| 5,170,448 | 12/1992 | Ackley et al. | 385/31 |
| 5,189,544 | 2/1993 | Sailer | 359/153 |
| 5,191,590 | 3/1993 | Kuindersma et al. | 372/50 |
| 5,446,814 | 8/1995 | Kuo et al. | 385/31 |
| 5,452,384 | 9/1995 | Kurita et al. | 385/33 |
| 5,479,540 | 12/1995 | Boudreau et al. | 385/14 |
| 5,497,438 | 3/1996 | Ishikawa et al. | 385/38 |

FOREIGN PATENT DOCUMENTS

| | | | |
|---|---|---|---|
| 0366974 | 9/1990 | European Pat. Off. | 385/88 X |
| 3914835 | 7/1990 | Germany | 385/88 X |
| WO93/21551 | 10/1993 | Germany | 385/33 X |
| 4313487A1 | 5/1994 | Germany | 385/88 X |
| 4313493A1 | 5/1994 | Germany | 385/88 X |
| 59-121008 | 7/1984 | Japan | 385/88 X |

*Primary Examiner*—Brian Healy
*Attorney, Agent, or Firm*—Michael J. Striker

[57] ABSTRACT

In the case of the above devices, exact adjustment is very important; however, the devices ought to be very compact. It is not sufficient to utilize the silicon etching technique for the precision. The optical transmitting element (LD) is situated on a first carrier (T1), the optical receiving element (PD) and the transmission fiber (Fa) are situated on a third carrier. Provided in between them is a second carrier (T2) which is transparent to the wavelength of the light emitted by the transmitting element (LD). The carriers are structured by means of anisotropic etching in order to make possible the accommodation of the individual components. In addition, the carriers lie flat on one another and can thus be adjusted. A monitor diode (MD) is provided. Application of the arrangement in all transmission systems having optical waveguides.

7 Claims, 5 Drawing Sheets

5,577,142

OPTICAL FIBER TRANSMITTING AND RECEIVING COMMUNICATIONS DEVICE

BACKGROUND OF THE INVENTION

The invention relates to an optical transmitting and receiving device according to the preamble of patent claim 1.

In the case of an optical transmitting and receiving device, a transmission fiber must be coupled to a transmitting element, commonly a laser diode, and to a photodiode as receiving element. In the transmission fiber, the transmitted and received signals are transmitted simultaneously in the opposite direction. In the case of the same wavelength, the transmitted and received signals are separated by a beam splitter and, in the case of different wavelengths, are separated by a wavelength selective brancher. In order to obtain the lowest possible coupling losses, the fiber must be coupled both to the laser diode and to the receiving diode in an optimum fashion. In order to couple a laser to a monomode fiber, a beam transformation has to be carried out because of the different beam characteristics of both. For this purpose, imaging using one Or two lenses is normally used. The necessary magnification M is about three to five, according to the ratio of the mode field diameter of laser and fiber. Tolerances in the position of the laser are compensated by an active adjustment of the fiber. In the lateral direction, that is to say transverse to the beam direction, the adjustment range necessary for this is greater by the factor M than the lateral tolerance range of the laser and, in the axial direction, it is greater by the factor $M^2$. The adjustment of the fiber in relation to the laser also influences the adjustment of the fiber in relation to the photodiode, so that in particular a small-area photodiode that is suitable for relatively high frequencies must likewise be actively adjusted in relation to the fiber.

DE 39 14 835 C1 discloses an arrangement for coupling an optical waveguide to an optical transmitting or receiving element.

Adjustment in the plane lateral to the optical axis is achieved by fixing the optical waveguide and optical transmitting or receiving element on different carriers which lie with their carrier surfaces on one another in a displaceable manner, and by the beam of light passing from the optical waveguide to the optically active element or vice versa by means of twofold reflection at each mirror plane located on a carrier. By displacing the carrier, a lateral adjustment is carried out. The carrier that carries the transmitting or receiving element can comprise a substrate and a part fitted thereon which has a continuous opening through which the beam of light passes. Application of the arrangement is possible in all transmission systems having optical waveguides, and in duplexers having input or output coupling of light. For the case of coupling to a transmitting element, a receiving element can be provided on the carrier with the fiber.

SUMMARY OF THE INVENTION

Proceeding from this prior art, it is the object of the invention to specify an optical transmitting and receiving device in which the adjustment outlay is reduced and the mounting is simplified.

The object is achieved by means of an invention having the features of patent claims 1 and 2. Advantageous developments are specified in the subclaims.

In order to reduce the adjustment outlay and to simplify the mounting, an optical transmitting and receiving device is proposed in which only one adjustment process, which is active and can be automated, is necessary and in which, by means of holding structures which are precise and inexpensively produced on a large scale, the mounting of the optical components is significantly simplified.

BRIEF DESCRIPTION OF THE DRAWINGS

Exemplary embodiments of the invention are described with reference to the drawings, in which.

DETAILED DESCRIPTION OF THE INVENTION

Figure 1:
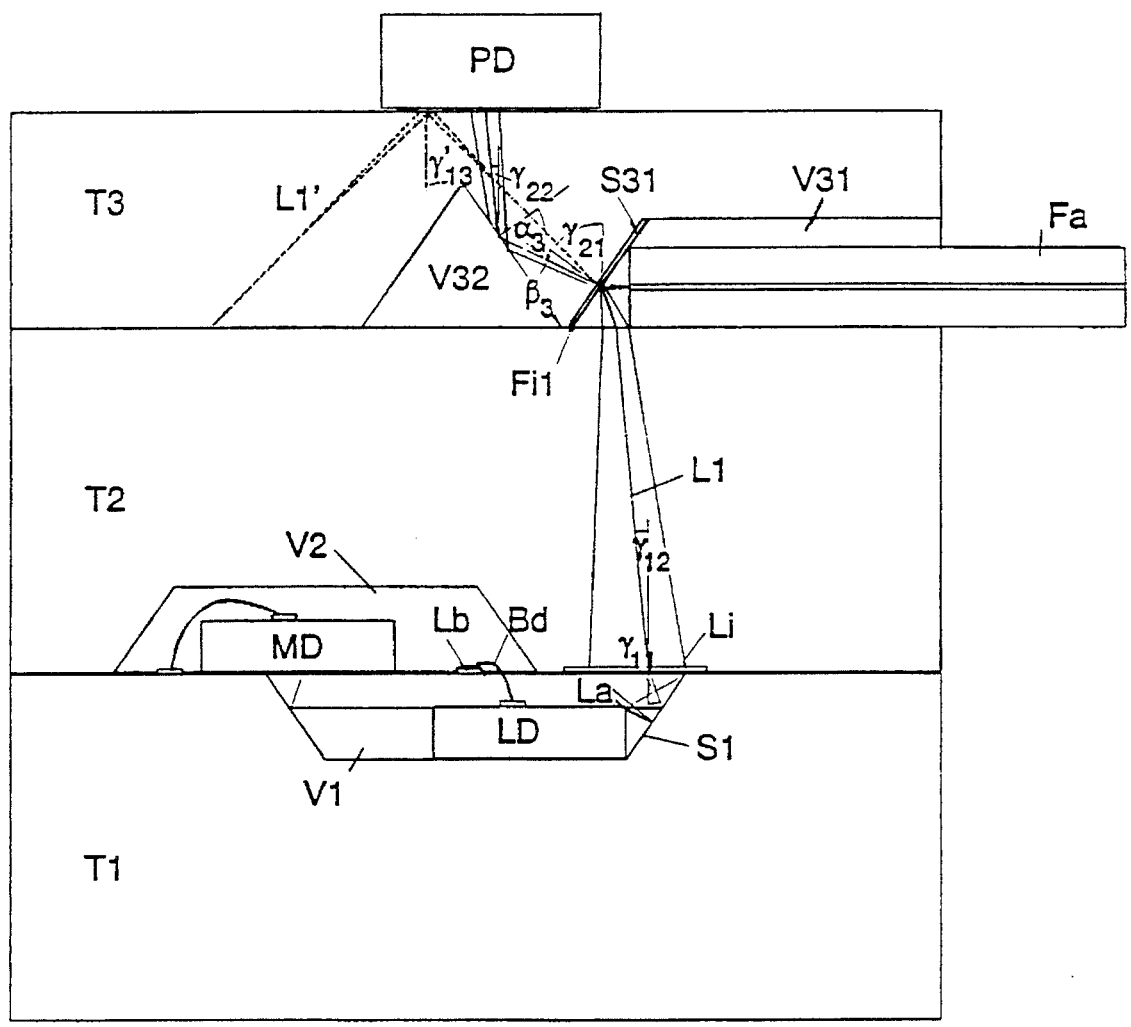
FIG. 1 shows a section through an arrangement according to the invention having a monitor diode on the carrier of the laser diode.

A first exemplary embodiment of the solution according to the invention is shown in FIG. 1. In a first carrier T1, which consists of monocrystalline silicon, a depression V1 is produced by means of anisotropic etching and has a flat bottom B1 on which a laser diode LD is mounted. The side surfaces of the depression, as a result of the anisotropic etching process, have an angle of inclination of $\alpha=\arctan(\sqrt{2})=54.7°$. To facilitate the positioning, during assembly the laser diode is placed on the base lines of at least two side surfaces lying at right angles to each other. One of these side surfaces S1 lies in front of the end face of the laser with the light exit surface LA. The side surface S1 is silvered, so that the beam of light L1 emerging from the laser is reflected obliquely upward. The central ray of the beam, emerging initially horizontally, includes an angle $\gamma_{11}=2 * \alpha-90°=19.5°$ with the normal of the top surface of the carrier T1 after the reflection at the side wall S1. Fitted above the carrier T1 is a second carrier T2 which is transparent to the wavelength $\lambda_1$ of the laser light. For example, this second carrier can likewise consist of silicon. However, another transparent material is also possible that can be micromechanically structured, such as a photolithographically structurable glass. On the underside of the carrier T2, in the region in which the beam of light L1 impinges, a lens Li is fitted. This lens can advantageously be a Fresnel lens, fitted in a planar manner, or a holographic lens. However, other types of lens are also possible such as a spherical lens, which is seated in a micromechanically shaped depression, or a lens produced by dry etching. In addition, a depression V2 is made in the under side of the carrier T2, so that space remains for bond wires Bd and conductor tracks Lb to make contact with the laser diode LD and for further optical or optoelectronic components which are mounted on the upper side of the carrier T1. Fitted here is a monitor diode MD for monitoring the laser power. The lens Li converts the initially divergent beam of light L1 into a convergent beam. As a result of the refraction of light at the interface of the carrier T2, the central ray of the beam of light is refracted at the angle $$\gamma_{12}=\arcsin((n_0n_2) * \sin(\gamma_{11}))$$

where $n_0$ is the refractive index in the space of the depression V1 and $n_2$ is the refractive index in the carrier T2.

If the carrier T2 is made of silicon with a refractive index $n_2=3.4777$ and $n_0=1$ for air, $\gamma_{12}=5.5°$.

On the upper side of the carrier T2, the beam of light is refracted back once more in the original direction $\gamma_2$. Fitted there is a further carrier T3 which, like the carrier T1, likewise consists of monocrystalline silicon. In this carrier T3, two depressions V31 and V32 are anisotropically etched. The depression V31 is a V-groove to accommodate the transmission fiber Fa. The width of this V-groove is in this case expediently so large that the bottom envelope line of the fiber just comes to lie in the plane of the underside of T3. The front end S3 of the V-groove is coated with a wavelength-selective filter Fi1. This filter is designed such that the transmitted wavelength $\lambda_1$ is reflected and the received wavelength $\lambda_2$ is let through. The transmitted beam of light L1 is reflected once more in the horizontal direction at the end face S31, inclined at the angle $\alpha$, and is coupled into the transmission fiber Fa. The received beam of light L2, emerging from the transmission fiber at the wavelength $\lambda_2$, penetrates the filter Fi1 and is refracted into the silicon at the boundary to the silicon at the angle $$\gamma_{21}=\alpha+\beta_3$$

where $\beta_3$ is the angle of refraction at the end face S31, with $$\beta_3=\arcsin((n_0/n_3),\sin(90°-\alpha))$$

with respect to the normal to the substrate surface of T3. In this case, $n_0$ is the refractive index in the V-groove V31, and $n_3=3.4777$ the refractive index in the silicon carrier T3. With $n_0=1$ for air, one obtains $\beta_3=9.6°$ and $\gamma_{21}=64.3°$. The beam of light L2 is incident on the side surface S31 of the depression V31 at an angle of incidence of $$\alpha_3=180°-2 * \beta_3=61.0°$$

Since this angle $\alpha_3$ is greater than the limiting angle of total reflection at the silicon/air transition of $$\alpha_g=\arcsin(n_0/n_3)=16.7°$$

the beam of light L2 is refracted at the angle $$\gamma_{22}=\alpha_3-\alpha=6.3°$$

with respect to the normal to the carrier surface. The angle $\gamma_{22}$ is smaller than $\alpha_g$, so that the beam of light L2 can emerge on the surface of the silicon carrier T3. The receiving diode PD is mounted at the exit point of the beam of light L2. The position for the photodiode results from the above-mentioned angles and the distance of the two depressions V31 and V32 from each other, and with a lower dependence on the thickness of the carrier T3. The position of the light exit surface of L2, on the other hand, does not depend on the axial position of the fiber Fa in the V-groove V31. The position of the light exit surface can therefore be characterized in relation to the micromechanically produced depressions V31 and V32 by marks or stops. These marks or stops can be very precisely aligned with the depressions V31 and V32 by means of photolithographic technology. By means of lateral displacement of the carrier T3 in relation to the carrier T2, lateral adjustment of the fiber Fa in relation to the image point of the transmitted beam of light L1 is possible. Also, any axial adjustment of the fiber which may be necessary by displacing the fiber in the V-groove V31 is possible without the position of the light exit surface of the received beam of light L2 being changed thereby. The object of keeping the position of the photodiode in relation to the received beam of light, irrespective of the adjustment of the fiber in relation to the transmitted beam of light, is thus achieved by means of the described arrangement according to the invention. In this case, it is further very advantageous that all the optoelectronic components can be mounted in a planar fashion.

A further advantage of the solution according to the invention lies in the fact that a very high near crosstalk attenuation can be achieved here. A high near crosstalk attenuation is necessary in order that the transmitted signal from the laser is not incident, as a consequence of insufficient directional separation, in the receiving diode which is located in the vicinity of the transmitter and in order that said receiving diode is not disturbed by said transmitted signal on receiving weak useful signals. Filter layers have generally only a limited capability of separating various wavelengths. Hence, a small proportion of the transmitted beam of light L1 will also penetrate the filter layer S31. The beam course of this interfering light is shown dotted as S1'. However, this beam of light impinges at the angle $$\gamma_{13}=\alpha-\beta_3=45.2°$$

with respect to the normal to the surface of the carrier T3. However, this angle is greater than the limiting angle of total reflection $\alpha_g=16.7°$, so that the direct interfering light from the transmitter cannot get into the receiving diode.

Figure 1A:
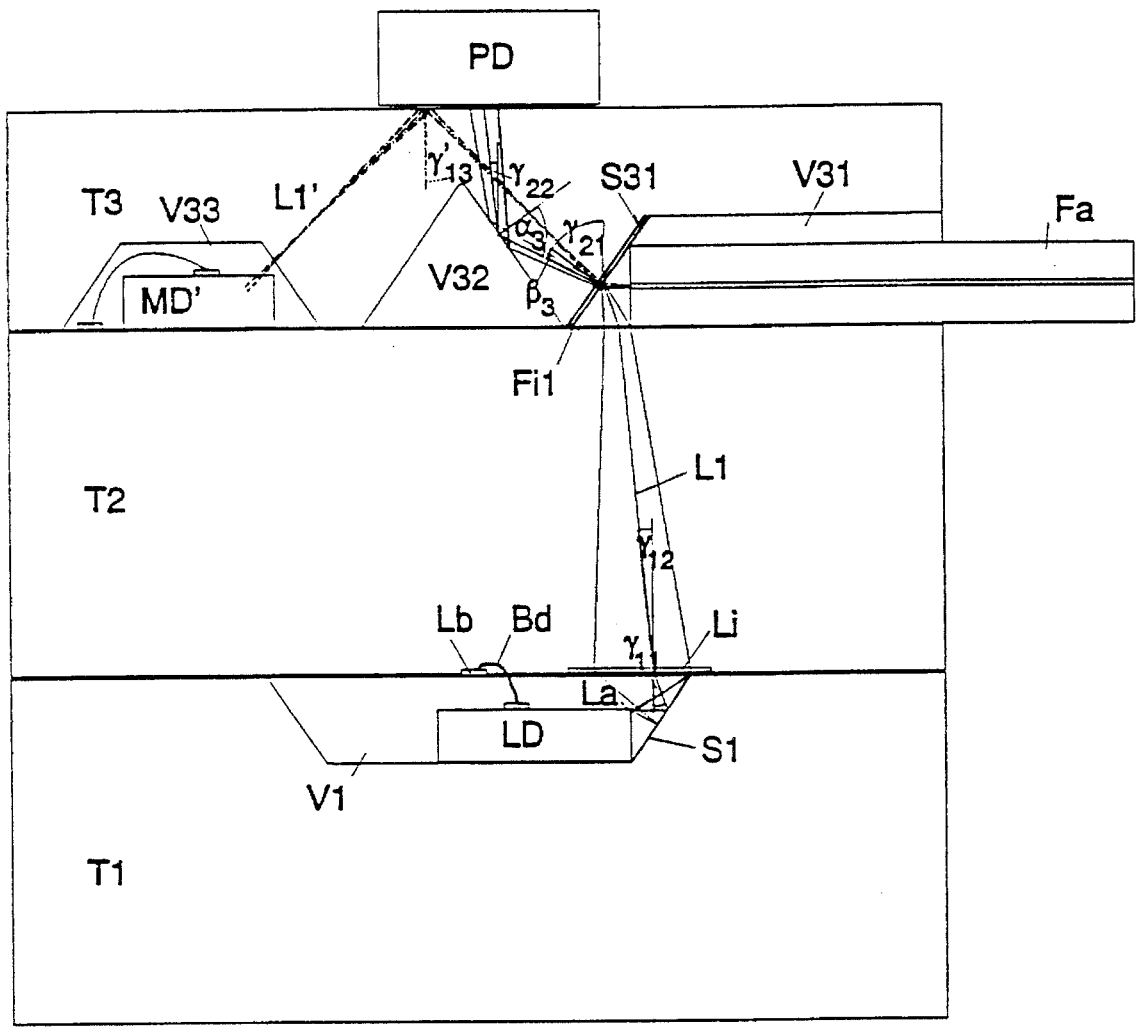
FIG. 1a shows a section through an arrangement according to the invention having a monitor diode on the carrier of the transmission fiber.

In a variant of the first exemplary embodiment, the filter Fi1 is designed such that another small part of the transmitted light penetrates the filter, whereas the major part is reflected. This beam of light L1', penetrating the filter, is used according to the invention as a control signal. The monitor diode MD' is then not mounted on the carrier T1 but in a recess V33 on the carrier T2. This is shown dotted in FIG. 1a.

Figure 2:
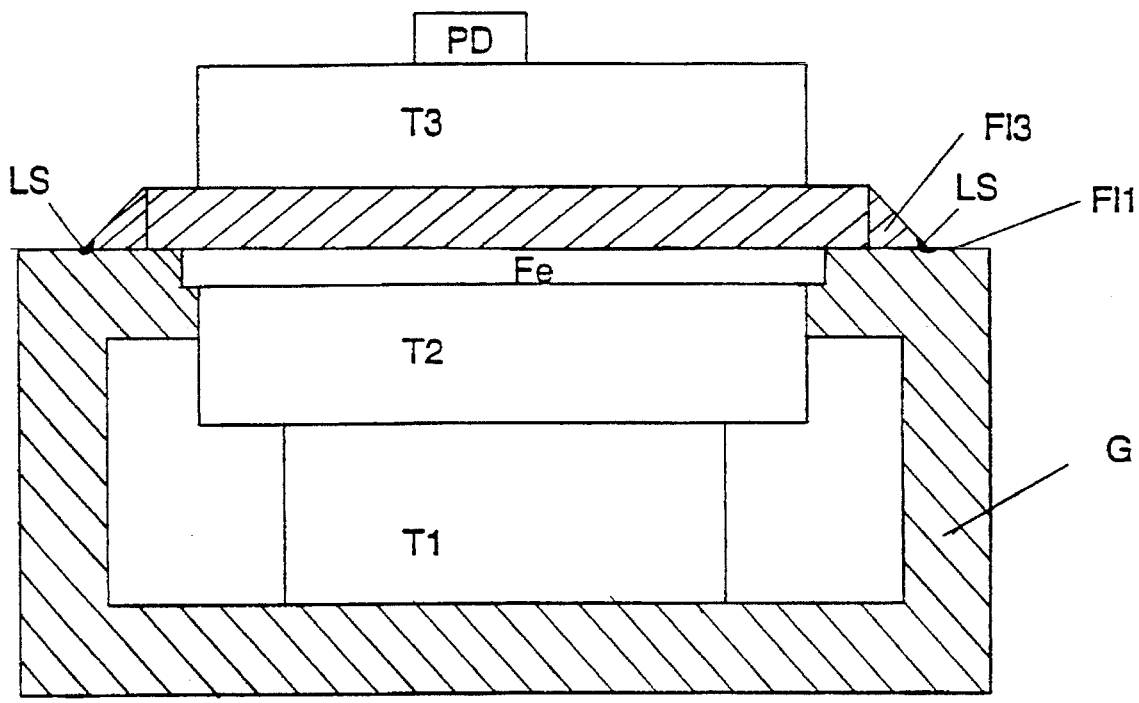
FIG. 2 shows the construction for adjusting the arrangement.

For the purposes of the lateral active adjustment of the fiber in relation to the transmitted beam of light L1, the carrier T3 is expediently inserted in a metal flange F13 whose edge area bears on the side wall Sw, designed as a flange area F11, of a housing G in which the carriers T1 and T2 are mounted. After reaching the optimum coupling position, the flange areas F13 and F12 are fixed in their position in relation to each other by means of laser weld points LS, for example. In this case, the carrier T2 can serve as a transparent, hermetically tight cover of the housing G. Likewise, an additional hermetically tight window Fe can also be inserted between the carriers T2 and T3 (see FIG. 2).

Figure 3:
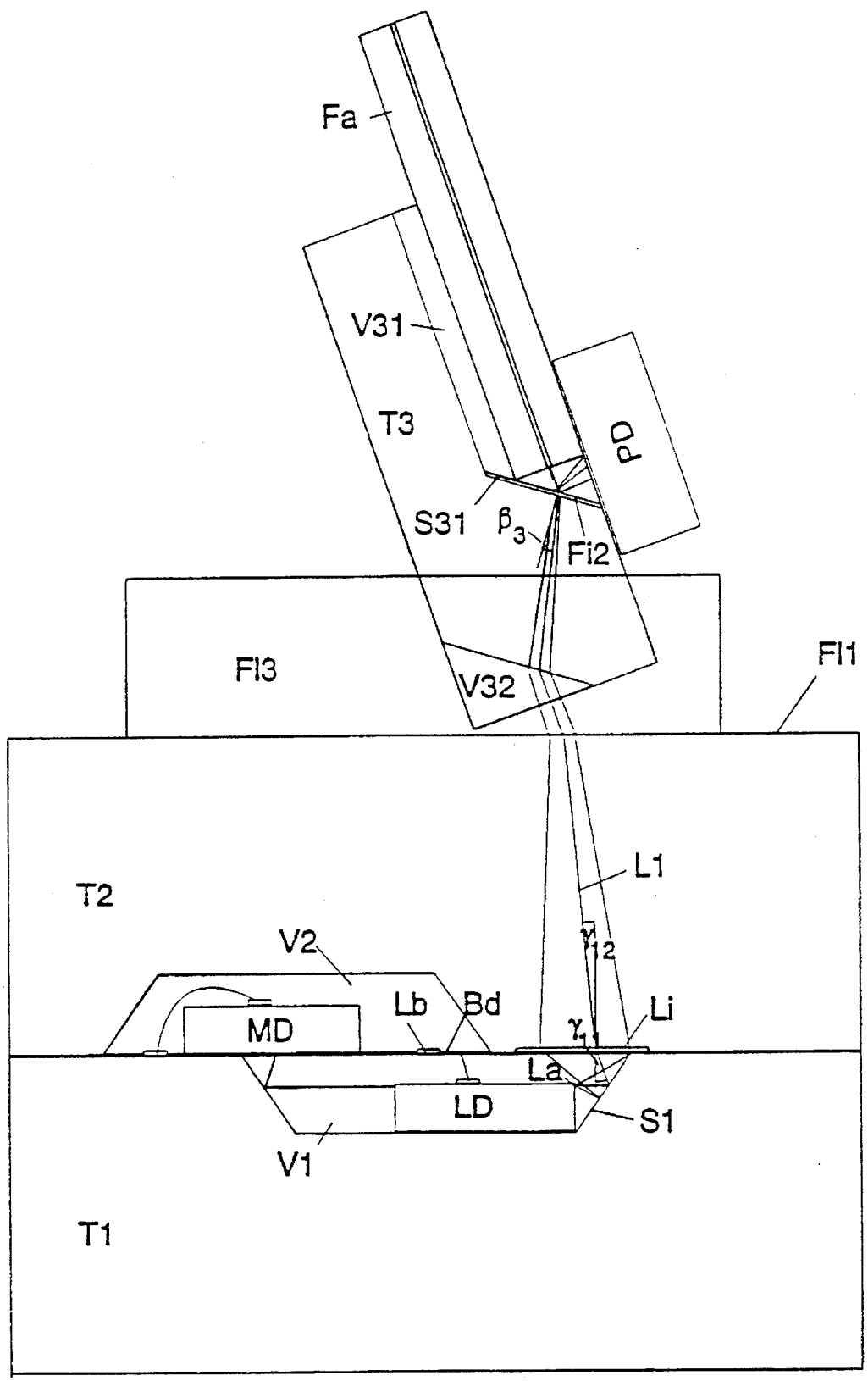
FIG. 3 shows an arrangement according to the invention, the third carrier being aligned with its front end towards the first carrier

In a second exemplary embodiment of the solution according to the invention, the carrier T3 is aligned in relation to the carrier T2 not with its underside but with its front end. The second exemplary embodiment according to the invention is shown in FIG. 3. The carriers T1 and T2 are constructed as in the first exemplary embodiment. The fiber Fa is also here once more guided in a V-groove V31 in a carrier T3 and can also be adjusted axially in this V-groove. The front end S31 is likewise coated with a wavelength-selective filter layer Fi2. Differing from the filter layer Fi1 in the first exemplary embodiment, the filter layer Fi2 is transparent to the transmitted wavelength $\lambda_1$ and reflective for the received wavelength $\lambda_2$. The beam of light L1 emerging from the carrier T2 at an angle of $\gamma_{11}=19.5°$ is incident on the side wall S31 of a depression V32 anisotropically etched from the opposite side into the carrier T3, that part of said depression lying opposite the side wall S32 having been removed, for example by sawing. Since the two side surfaces S32 and S31 are parallel to each other, the transmitted beam of light S1 is offset in a parallel fashion by the double refraction and is then incident in the transmission fiber Fa. The carrier T3 in this arrangement must be inclined at the angle $\gamma_{11}=19.5°$ with respect to the normal to the surface of the carrier T2. For this purpose, it is built, inclined at this angle, into the flange F3.

Figure 4:
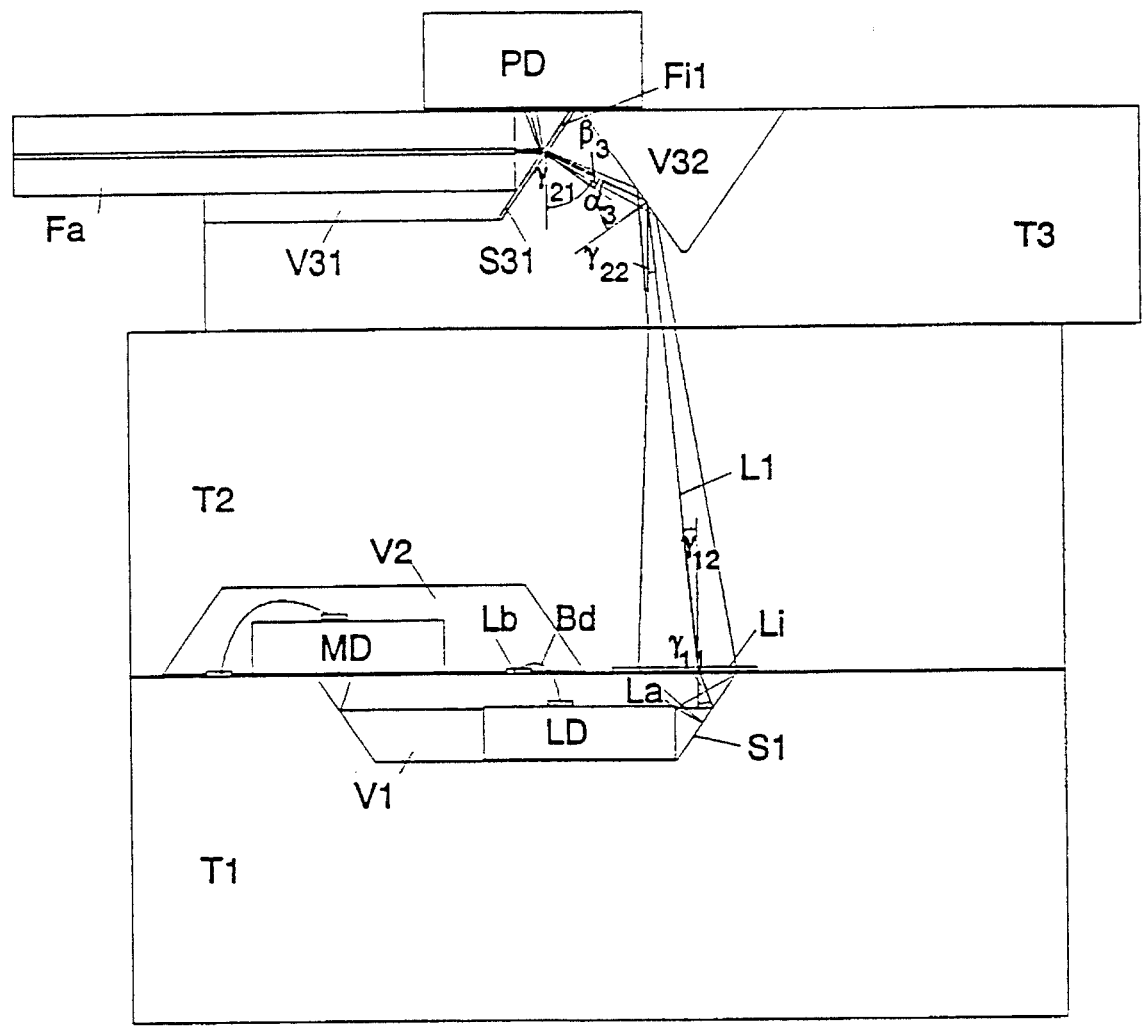
FIG. 4 shows an arrangement according to the invention in which the third carrier is mirrored vertically and horizontally with respect to the arrangement according to FIG. 1.

A third exemplary embodiment of the solution according to the invention is shown in FIG. 4. Here, the carrier T3 is constructed in a similar fashion to that in the first exemplary embodiment, but is mirrored vertically and horizontally with respect to the first exemplary embodiment. As in the exemplary embodiment 2, the filter layer Fi2 must be transparent to the transmitted wavelength and must be reflective for the received wavelength. The photodiode PD for the received signal is mounted in the region above the end face of the V-groove V31, as in exemplary embodiment 2. As in exemplary embodiment 2, there is also the advantage here that the path between the fiber end face and the photodiode is very short, the result of which is a low beam expansion which therefore permits a very small-area photodiode which is suitable for high frequencies. The direction angle $\gamma_{12}$ of the beam in the carrier T2 is 5.5° for the carrier material silicon and the direction angle $\gamma_{22}$ of the beam in the carrier T3 is 6.3°. The angular difference of 0.8° results in a coupling loss of about 0.1 dB and can be tolerated in most applications. The angle $\gamma_{12}$ may be corrected, however, by the position of the lens center of the lens Li in relation to the surface S1. The light path, which is longer here compared with the first exemplary embodiment, in the carrier T3 for the transmitted beam of light must be compensated by a corresponding thickness of the carrier T2.

A very important point of view as regards the costs in the use of laser diodes in transmitting modules or transmitting and receiving modules lies in the fact that the laser diodes can be tested as early as possible during the production process. While electrical tests can already be carried out before individualization, optical tests can often be carried out only following mounting on individual subsinks or even only on the finished module. In the case of the mounting process according to the invention, the laser diodes can be tested for their optical functioning at a very early stage and on a large scale. For this purpose, the laser diodes are mounted into the depressions V1 of a carrier substrate T1 produced on a large scale, before this carrier substrate is individualized into individual carriers. In this way, the optical properties can be tested together for a great number of laser diodes. The carrier T2 with the lens Li is likewise produced on a large scale for many individual modules and all the lenses are mounted together in relation to the lasers in a single adjustment and mounting process. Here, passive adjustment by means of marks or adjustment-free mounting by means of micromechanically structured stops is possible. The depressions V2 in the carrier T2 are in this case configured such that the optoelectronic and electronic components such as the laser diode LD, the monitor diode MD or electronic components, not shown here, for driving the laser are enclosed in a hermetically tight manner. After the common connection of the carrier substrates T1 and T2, the latter are individualized by sawing or by breaking at micromechanically produced deliberate breaking lines. The position of the saw lines or breaking lines is in this case located such that the position of the depressions V1 and V2 and of the lenses Li are not touched.

The monitor diode MD can also be mounted on the underside or upper side of the carrier T2 or T3, corresponding recesses having to be provided in the respectively adjacent carrier. A further lens Lim can be provided on the carrier T2 for the purpose of coupling the monitor diode.

We claim:

1. An optical transmitting and receiving device comprising a first carrier (T1), a third carrier (T3), a second carrier (T2) located between the first carrier (T1) and the third carrier (T3), said first carrier (T1) and said third carrier (T3) being provided with anisotropically etched depressions (V1, V31, V32); a transmitting element (LD) fixed on the first carrier (T1) and including means for emitting light of a wavelength such that said third carrier (T3) is transparent to said light; at least one mirror surface element (S1,S31) provided on each of the first carrier (T1) and the third carrier (T3); a transmission fiber (Fa) arranged on the third carrier (Fa); a monitor diode (MD) mounted on a top surface of the first carrier (T1) in a recess of the second carrier (T2) and a receiving element (PD) fixed to the third carrier (T3).

2. The optical transmitting and receiving device as defined in claim 1, wherein said transmission fiber (Fa) is arranged in one of said depressions (V31) formed as a V-groove in the third carrier (T3); and wherein said depressions said transmitting element, said at least one mirror surface (S1,S31) of the first and third carrier and said transmission fiber (Fa) are formed and positioned so that said light passes from said transmitting element (LD) into said transmission fiber (Fa) by reflection from said at least one mirror surface.

3. The optical transmitting and receiving device as defined in claim 2, wherein said at least one mirror surface is oriented relative to said transmission fiber (Fa) and said transmitting element (LD) so that an axial displacement of said transmission fiber (Fa) in said V-groove does not change a position of a light exit surface of a received beam of said light.

4. The optical transmitting and receiving device as defined in claim 1, wherein the transmission fiber (Fa) has an optical axis and the third carrier with the transmission fiber (Fa) is positioned so that the optical axis of the transmission fiber (Fa) forms an angle between 50° and 90° relative to a top surface of at least one of the first and second carriers (T1,T2).

5. An optical transmitting and receiving device comprising a first carrier (T1), a third carrier (T3), a second carrier (T2) located between the first carrier (T1) and the third carrier (T3), said first carrier (T1) and said third carrier (T3) being provided with anisotropically etched depressions (V1, V31, V32); a transmitting element (LD) fixed on the first carrier (T1) and including means for emitting light of a wavelength such that said third carrier (T3) is transparent to said light; at least one mirror surface element (S1,S31) provided on each of the first carrier (T1) and the third carrier (T3); a transmission fiber (Fa) arranged on the third carrier (Fa); a monitor diode (MD) mounted on a top surface of the second carrier (T2) in a recess of the first carrier (T1) and a receiving element (PD) fixed to the third carrier (T3).

6. The optical transmitting and receiving device as defined in claim 5, wherein said transmission fiber (Fa) is arranged in one of said depressions (V31) formed as a V-groove in the third carrier (T3); and wherein said depressions, said transmitting element, said at least one mirror surface (S1,S31) of the first and third carrier and said transmission fiber (Fa) are formed and positioned so that said light passes from said transmitting element (LD) into said transmission fiber (Fa) by reflection from said at least one mirror surfaces.

7. The optical transmitting and receiving device as defined in claim 6, wherein said at least one mirror surface is oriented relative to said transmission fiber (Fa) and said transmitting element (LD) so that an axial displacement of said transmission fiber (Fa) in said V-groove does not change a position of a light exit surface of a received beam of said light.

* * * * *